(12) United States Patent
Yukimoto et al.

(10) Patent No.: US 7,271,421 B2
(45) Date of Patent: Sep. 18, 2007

(54) LIGHT-EMITTING DIODE ARRAY

(75) Inventors: Tomihisa Yukimoto, Hitachi (JP); Eiichi Kunitake, Hitachi (JP); Satoshi Sugiyama, Hitachi (JP); Toshimitsu Sukegawa, Hitachi (JP); Masahiro Noguchi, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 321 days.

(21) Appl. No.: 10/910,658

(22) Filed: Aug. 4, 2004

(65) Prior Publication Data

US 2005/0029529 A1 Feb. 10, 2005

(30) Foreign Application Priority Data

Aug. 8, 2003 (JP) ............................. 2003-289909

(51) Int. Cl.
 *H01L 33/00* (2006.01)
 *H01L 23/48* (2006.01)
(52) U.S. Cl. ........................................ 257/92; 257/786
(58) Field of Classification Search ................ 257/79, 257/89, 92, 98, 103, 91, 99, 786, 784
See application file for complete search history.

(56) References Cited

FOREIGN PATENT DOCUMENTS

| JP | 11-040842 | 12/1999 |
|---|---|---|
| JP | 2001-077431 | 3/2001 |

OTHER PUBLICATIONS

Oki Technical Reviews, No. 189, vol. 69 (No. 1), pp. 70-73, Jan. 2002.

*Primary Examiner*—Howard Weiss
*Assistant Examiner*—(Vikki) Hoa B. Trinh
(74) *Attorney, Agent, or Firm*—Sughrue Mion, PLLC

(57) ABSTRACT

A light-emitting diode array comprising a conductive layer formed on a substrate, pluralities of separate light-emitting portions formed on the conductive layer, a first groove formed in the conductive layer to divide the light-emitting portions to blocks, a first electrodes formed on at least part of an upper surface of each light-emitting portion, a second electrode formed directly on the conductive layer in each block, switching common wirings separately connecting the first electrodes and first bonding pads each connected to each common wiring, first bonding pads each connected to each common wiring, and second bonding pads each connected to each second electrode, the first bonding pads and the second bonding pads being arranged longitudinally in a row, and a ratio of the number of the first bonding pads to the number of the second bonding pads being 1:n (n≧3).

9 Claims, 9 Drawing Sheets

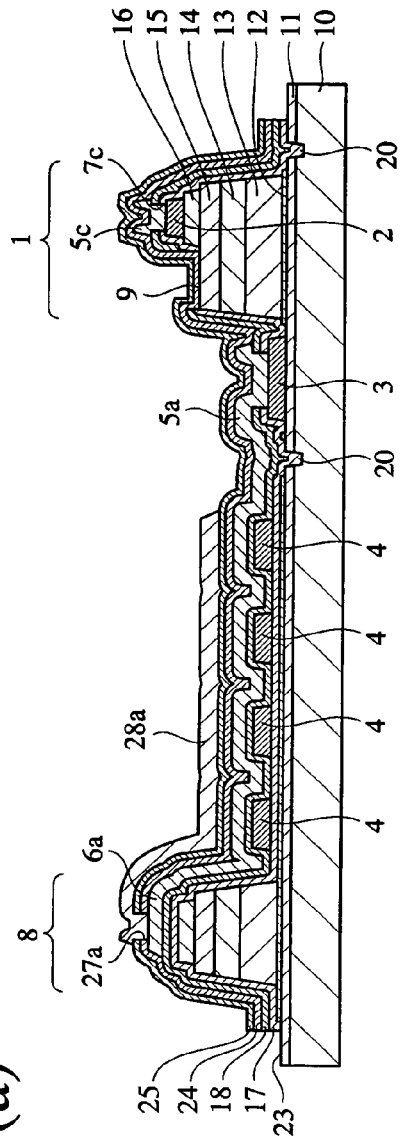
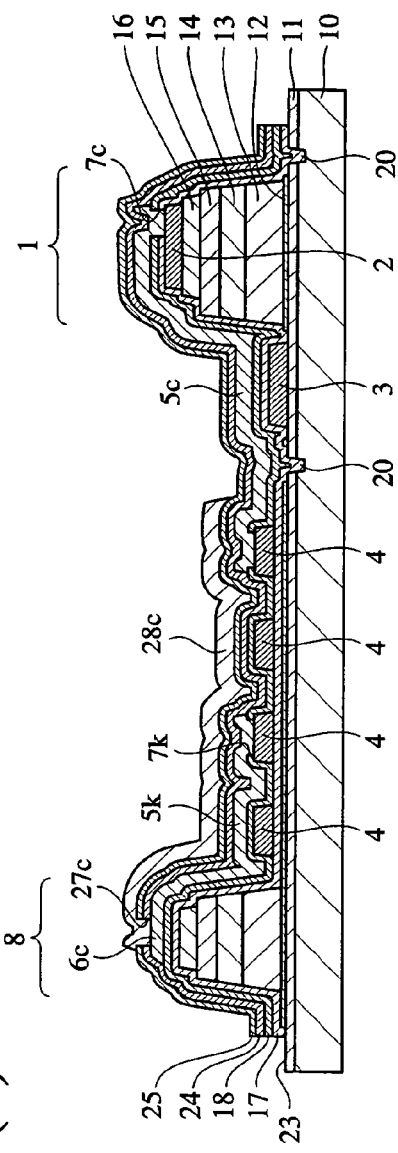
Fig. 7(a)
Fig. 7(b)

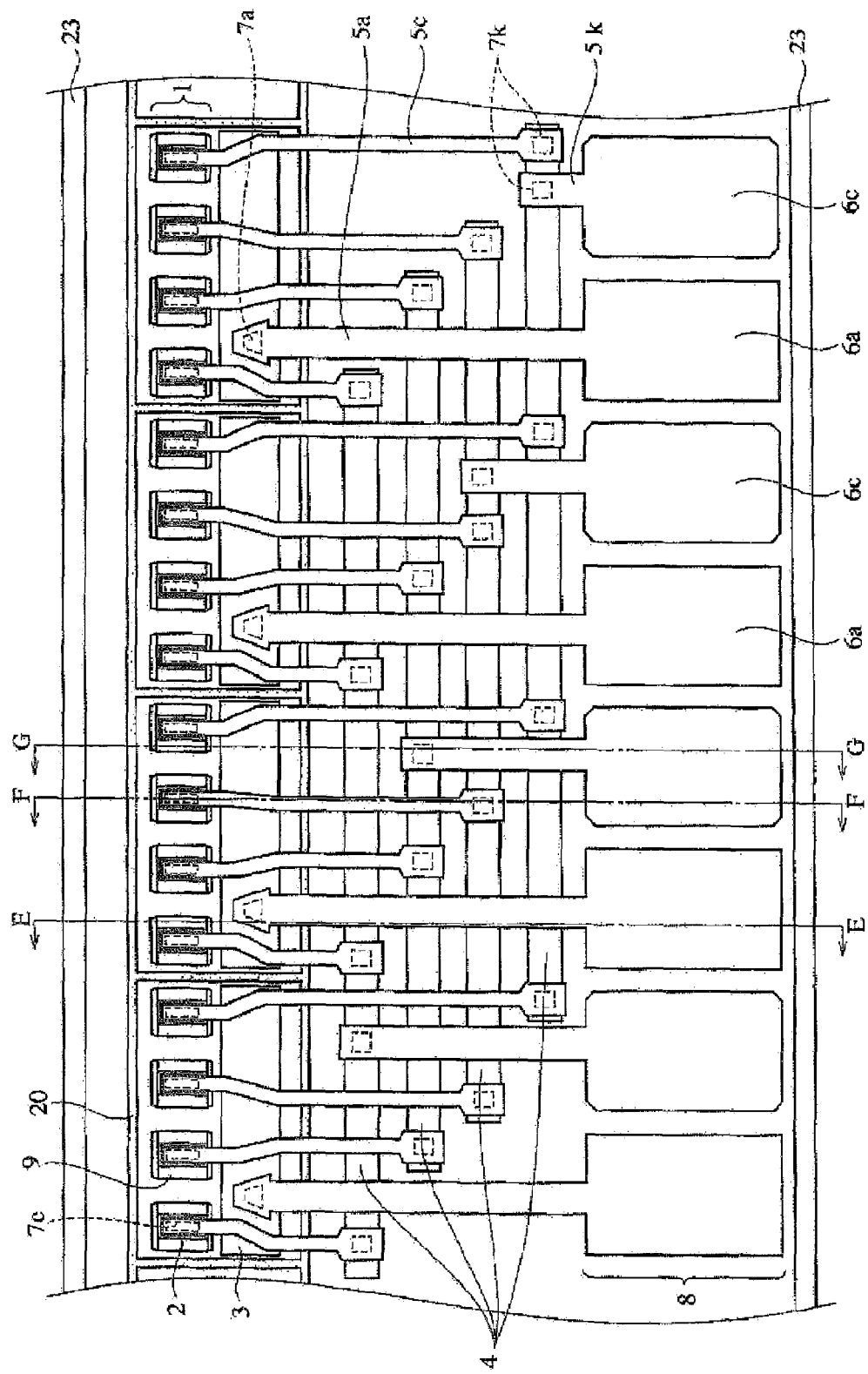
Fig. 8 -- Prior Art --

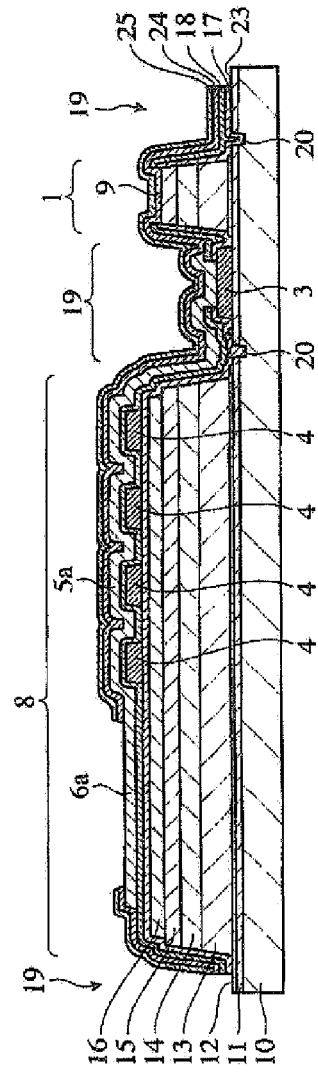
Fig. 9(a) -- Prior Art --
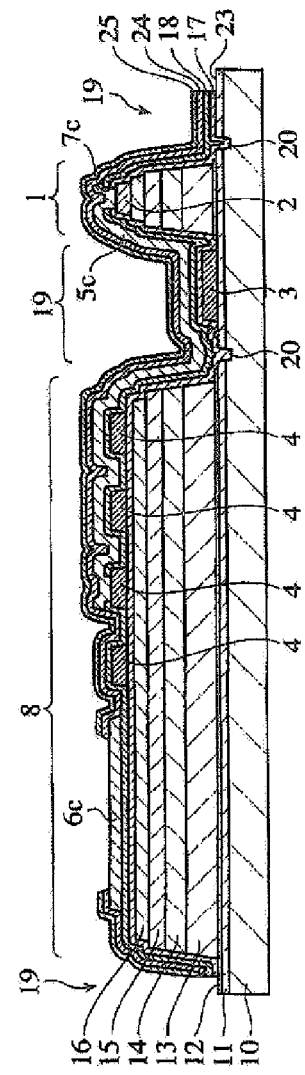
Fig. 9(b)
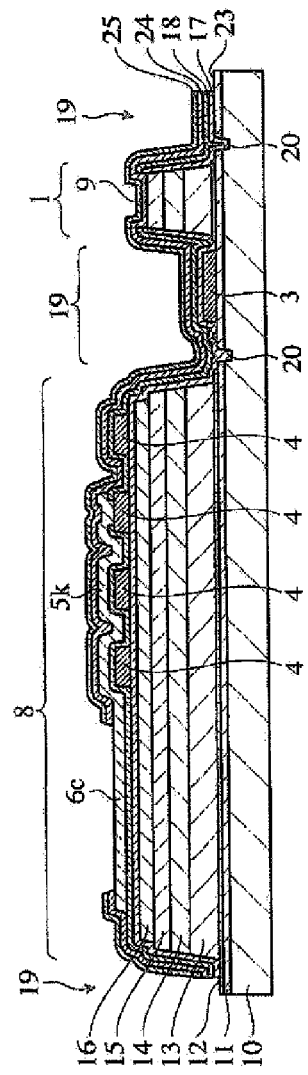
Fig. 9(c)

LIGHT-EMITTING DIODE ARRAY

FIELD OF THE INVENTION

The present invention relates to a small light-emitting diode array of high light output, and particularly to a light-emitting diode array suitable for light sources of electrophotographic printers, etc.

BACKGROUND OF THE INVENTION

An electrophotographic printer forms an electrostatic latent image on a photosensitive drum by light according to an image signal, develops the latent image by selectively attracting toner thereto, and then transfers the developed image onto a paper to obtain a print image. As a light source for forming the electrostatic latent image, a laser and a light-emitting diode array are widely used. In particular, since a light source constituted by the light-emitting diode array does not need a long optical path unlike the laser-type light source, it is suitable for small-sized printers. Because the light-emitting diode array can be laterally long, it is also suitable for large-sized printing. Demand has recently been mounting on light-emitting diode arrays of higher precision, higher light output and low in cost, as printing has been becoming faster with higher image quality, and as printers have been becoming smaller.

To achieve the reduction of the cost of light-emitting diode array heads, it is advantageous to replace a static driving system comprising ICs for separately driving light-emitting diodes, with a dynamic driving system or a matrix driving system, which comprises pluralities of light-emitting diodes in a block, and a switching matrix wiring subjected to time division operation, thereby reducing the number of driving ICs and bonding wires.

One of effective means for achieving further cost reduction in the production of a dynamic-driving light-emitting diode array seems to increase the number of LED array chips (referred to simply as "LED chips") per a wafer by reducing the size of the LED chips. However, because the LED chips should be arranged in numbers corresponding to a printing size in an LED head, the reduction of the size of the LED chips in a longitudinal direction results in increase in the number of the LED chips arranged, failing to achieve cost reduction. Accordingly, the miniaturization of the LED chips could be achieved only in a chip width direction.

The reduction of the width of an LED chip may be achieved by (i) the reduction of the size of bonding pads occupying most of the LED chip, or by (ii) the arrangement of first bonding pads connected to cathodes via common wirings and second bonding pads connected to anodes in a row on one side of the LED chip. Though both of the measures (i) and (ii) are optimally taken, particularly the measure (i) disadvantageously increases mass production cost, because there is a limit in the miniaturization of bonding pads per se, and because bonding apparatuses for small bonding pads are expensive. On the other hand, with respect to the measure (ii), it is difficult to provide each bonding pad with sufficient area, when the precision of the LED head is as high as 600 dpi, particularly 1200 dpi. The bonding pads in the LED chip generally need to be as large as 60 to 80 μm in a chip width direction (the longitudinal direction of the LED chip) and 80 to 120 μm in a longitudinal direction (the transverse direction of the LED chip).

One example of a light-emitting diode array of a four-partitioned dynamic driving system is shown in FIGS. 8 and 9. The light-emitting diode array of this example comprises a substrate 10, a conductive layer 11 formed on the substrate 10, pluralities of separate light-emitting portions 1 formed on the conductive layer 11, cathodes 2 each formed on an upper face of each light-emitting portion 1, anodes 3 formed on the conductive layer 11, four common wirings 4 separately connected to the cathodes 2 via lead wires 5c, bonding pads 6c separately connected to the common wirings 4, and bonding pads 6a separately connected to anodes 3 via lead wires 5a. As shown in FIG. 8, the bonding pads 6c, 6a are arranged in a row such that the ratio of the number of the bonding pads 6c to the number of the bonding pads 6a is 1:1. The light-emitting portions 1 are partitioned by a first rectangular groove 20 formed in the conductive layer 11 to blocks such that each block comprises four light-emitting portions 1.

The total number of the bonding pads 6c, 6a is half of the number of the light-emitting portions 1 in the LED chip. For instance, in a light-emitting diode array of 1200 dpi having a dot pitch of 21.2 μm, the width of each bonding pad should be less than 42.4 μm, less than a minimum size (60 μm) of each bonding pad.

To solve such problem, a light-emitting diode array comprising eight dots of diodes subjected to time-division driving via eight common wirings is disclosed (JP 2001-77431 A, and "Oki Technical Review," Vol. 69, No. 1, January, 2002, Serial No. 189). With an 8×8 multi-layer matrix wiring comprising eight common wirings as described therein, the number of bonding pads can be reduced to half, and thus a design margin in a chip width direction can be doubled to less than 84.8 μm. Increase in the number of common wirings, however, leads to increase in the width of an LED chip.

OBJECT OF THE INVENTION

Accordingly, an object of the present invention is to provide a small, high-output light-emitting diode array with low cost and excellent mass productivity.

DISCLOSURE OF THE INVENTION

As a result of intense research in view of the above object, the inventors have found that in a light-emitting diode array of a matrix driving system, by setting the number of first bonding pads connected to cathodes via common wirings and the number of second bonding pads connected to anodes at a predetermined ratio, the numbers of the first bonding pads and the common wirings can be reduced to decrease the width of the LED chip while having a necessary area for the bonding pads. The present invention has been completed based on this finding.

Thus, the light-emitting diode array of the present invention comprises a conductive layer formed on a substrate, pluralities of separate light-emitting portions formed on the conductive layer, a first groove formed in the conductive layer to divide the light-emitting portions to blocks, first electrodes formed on at least part of an upper surface of each light-emitting portion, a second electrode formed directly on the conductive layer in each block, switching common wirings separately connecting the first electrodes and first bonding pads each connected to each common wiring, first bonding pads each connected to each common wiring, and second bonding pads each connected to each second electrode, the first bonding pads and the second bonding pads being arranged longitudinally in a row, and a ratio of the number of the first bonding pads to the number of the second bonding pads being 1:n (n≧3).

The third and fourth bonding pads connected to each of the first and second bonding pads preferably extend on an insulating layer covering the common wirings.

The first and second bonding pads are preferably formed on separate bonding portions formed longitudinally in a row like islands on the conductive layer, and the light-emitting portions and the bonding portions are preferably separately formed by mesa-etched grooves.

The first electrodes preferably has a T shape comprising a connection portion extending from an end side (the farther side from the second electrode) of the light-emitting portion substantially in the width thereof, and an elongated portion extending from the connection portion in a center portion of the light-emitting portion, and the length of the connection portion of the first electrodes in a chip width direction of the array is preferably 20 µm or less.

Second grooves are preferably formed in the conductive layer between the adjacent light-emitting portions. The first groove surrounding each block is preferably in a rectangular shape comprising a groove on the side of the first electrodes, a groove on the side of the second electrode, and a pair of grooves separating adjacent blocks. The second grooves are preferably connected to the groove on the side of the first electrodes in a comb shape. Second grooves preferably extend substantially to a tip end (on the side of the second electrode) of the connection portion of the first electrodes.

BRIEF DESCRIPTION OF THE DRAWINGS

FIG. 7(a) is a cross-sectional view taken along the line C-C in FIG. 6;

FIG. 7(b) is a cross-sectional view taken along the line D-D in FIG. 6;

FIG. 8 is a top view showing one example of the conventional light-emitting diode array;

FIG. 9(a) is a cross-sectional view taken along the line E-E in FIG. 8;

FIG. 9(b) is a cross-sectional view taken along the line F-F in FIG. 8; and

FIG. 9(c) is a cross-sectional view taken along the line G-G in FIG. 8.

DESCRIPTION OF THE PREFERRED EMBODIMENTS

[1] Structure of Light-Emitting Diode Array

The light-emitting diode array of the present invention will be explained in detail referring to FIGS. 1 to 7. An insulating layer is omitted in the top view for the simplification of explanation.

Figure 1:
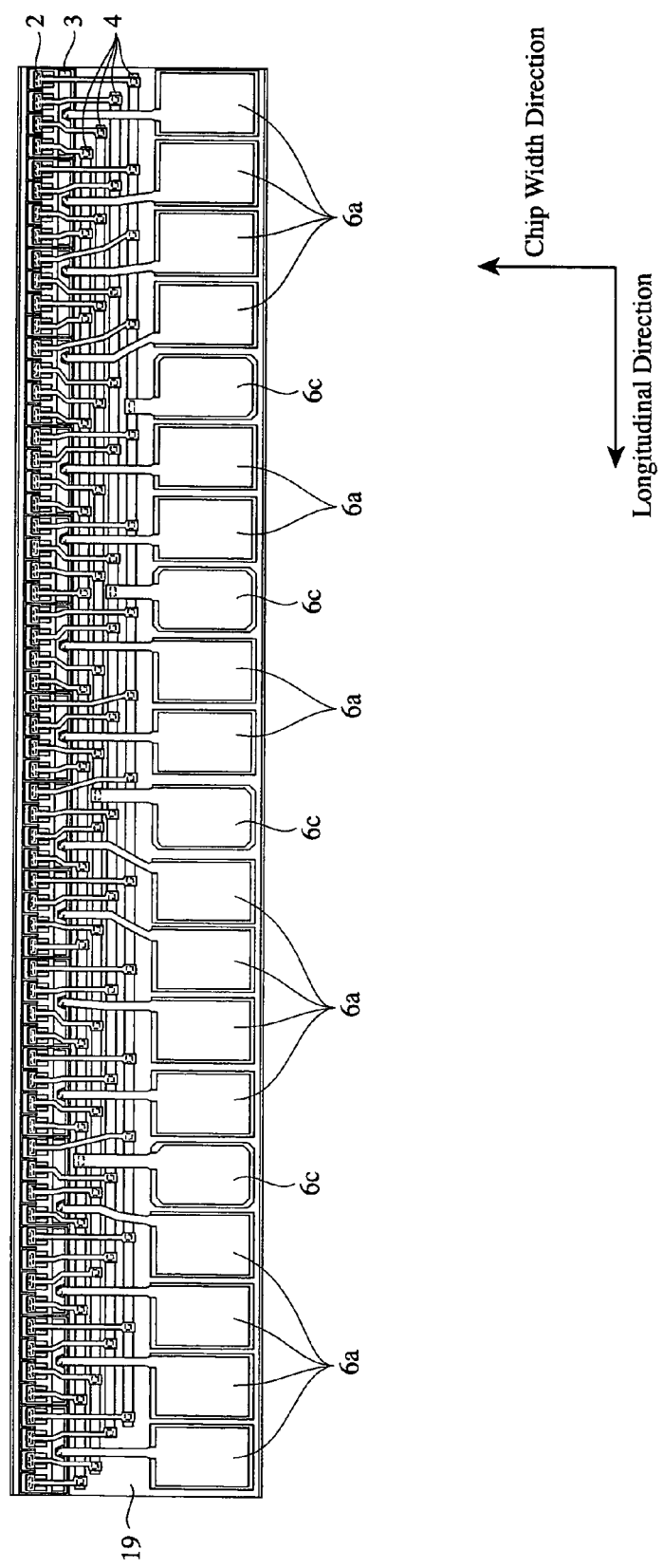
FIG. 1 is a top view showing a unit cell of the light-emitting diode array according to one embodiment of the present invention.
Figure 2:
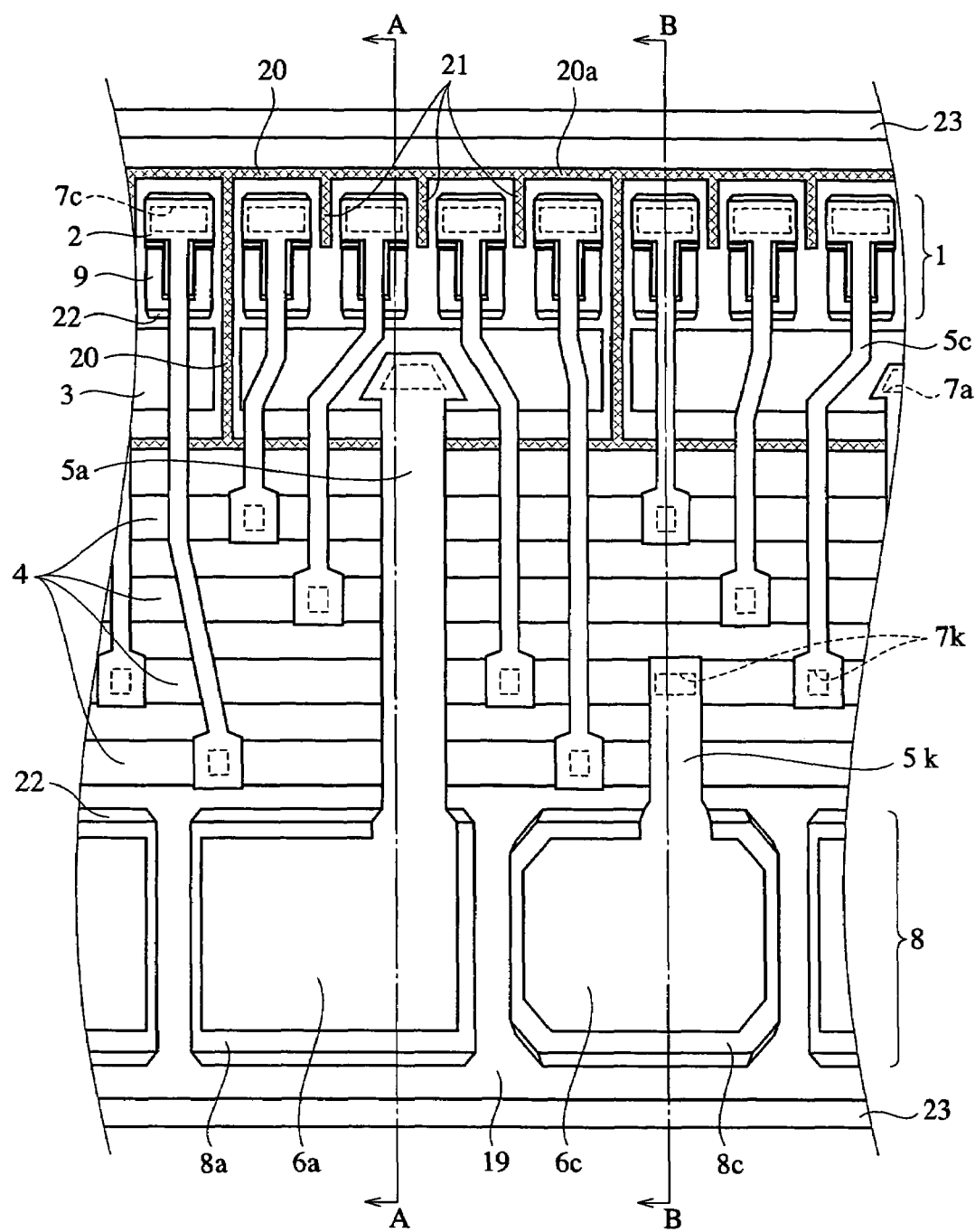
FIG. 2 is an enlarged top view showing part of the light-emitting diode array shown in FIG. 1.
Figure 3A:
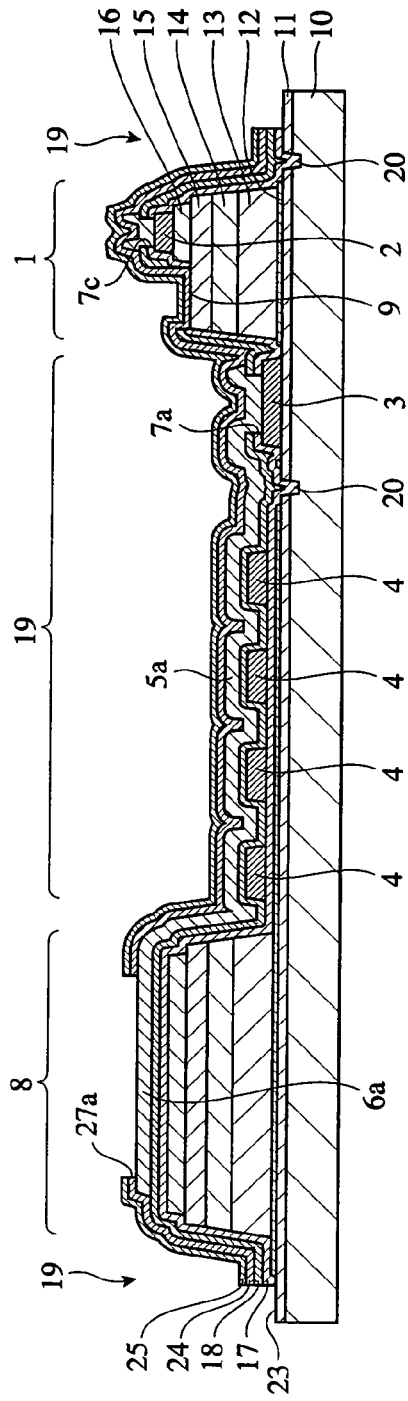
FIG. 3(a) is a cross-sectional view taken along the line A-A in FIG. 2.
Figure 3B:
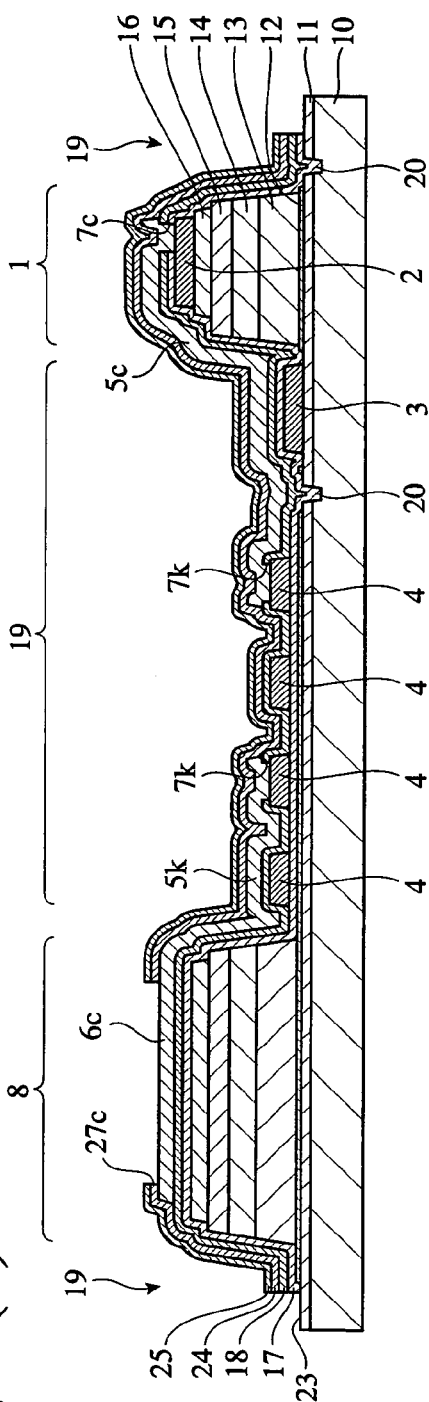
FIG. 3(b) is a cross-sectional view taken along the line B-B in FIG. 2.

FIG. 1 is a top view entirely showing a cell of a four-part matrix array according to one preferred embodiment of the present invention, and FIG. 2 is an enlarged top view showing part of the light-emitting diode array shown in FIG. 1. FIGS. 3(a) and 3(b) are cross-sectional views taken along the lines A-A and B-B, respectively, in FIG. 2.

In the illustrated embodiment, a cell has 16 blocks, each of which comprises four light-emitting portions 1. Accordingly, a cell is composed of 64 dots of the light-emitting portions 1. This light-emitting diode array comprises first electrodes (cathodes) 2 each formed in a T shape on each light-emitting portion 1, four switching common wirings 4 each connected to the cathode 2 on each light-emitting portion 1, a second electrode (anode) 3 disposed in each block, four bonding pads 6c each connected to each of the common wirings 4, and bonding pads 6a (16 in total) connected to the anode 3 in each block.

The bonding pads 6c and the bonding pads 6a are arranged longitudinally in a row in the LED chip, the ratio of the number of the bonding pads 6c to the number of the bonding pads 6a being 1:n (1:4 in this embodiment). The total number of the bonding pads 6a, 6c per one cell is 20, one-third or less of the number of the light-emitting portions 1. Accordingly, there is enough margin in the width of the bonding pads 6a, 6c arranged longitudinally in a row in the light-emitting diode array. Even when the light-emitting diode array in this embodiment is an LED array chip of 1200 dpi with a dot pitch of 21.2 µm and a bonding pad pitch of 67.8 µm, for instance, the bonding pads can meet the width condition of 60 to 80 µm with enough margin.

Four light-emitting portions 1 surrounded by the first rectangular groove 20 formed in the conductive layer 11 and bonding portions 8a, 8c each having a bonding pads 6a, 6c are separated by the mesa-etched grooves 19. Each light-emitting portion 1 is constituted by an epitaxial layer formed on the substrate 10. Switching common wirings 4 are formed between the bonding portions 8a, 8c and the first groove 20.

Each block comprises four light-emitting portions 1, a first rectangular groove 20 surrounding the light-emitting portions 1, three second grooves 21 extending from a side portion 20a (the farthest side from the anode 3) of the first groove 20 between the adjacent light-emitting portions 1, and an anode 3 formed on a conductive layer 11 at a position close to the light-emitting portions 1.

The first and second grooves 20, 21 are preferably mesa-etched grooves formed by completely removing the conductive layer 11. The first groove 20 electrically insulates the adjacent blocks from each other, and the second grooves 21 control current between the adjacent light-emitting portions 1.

Figure 4:
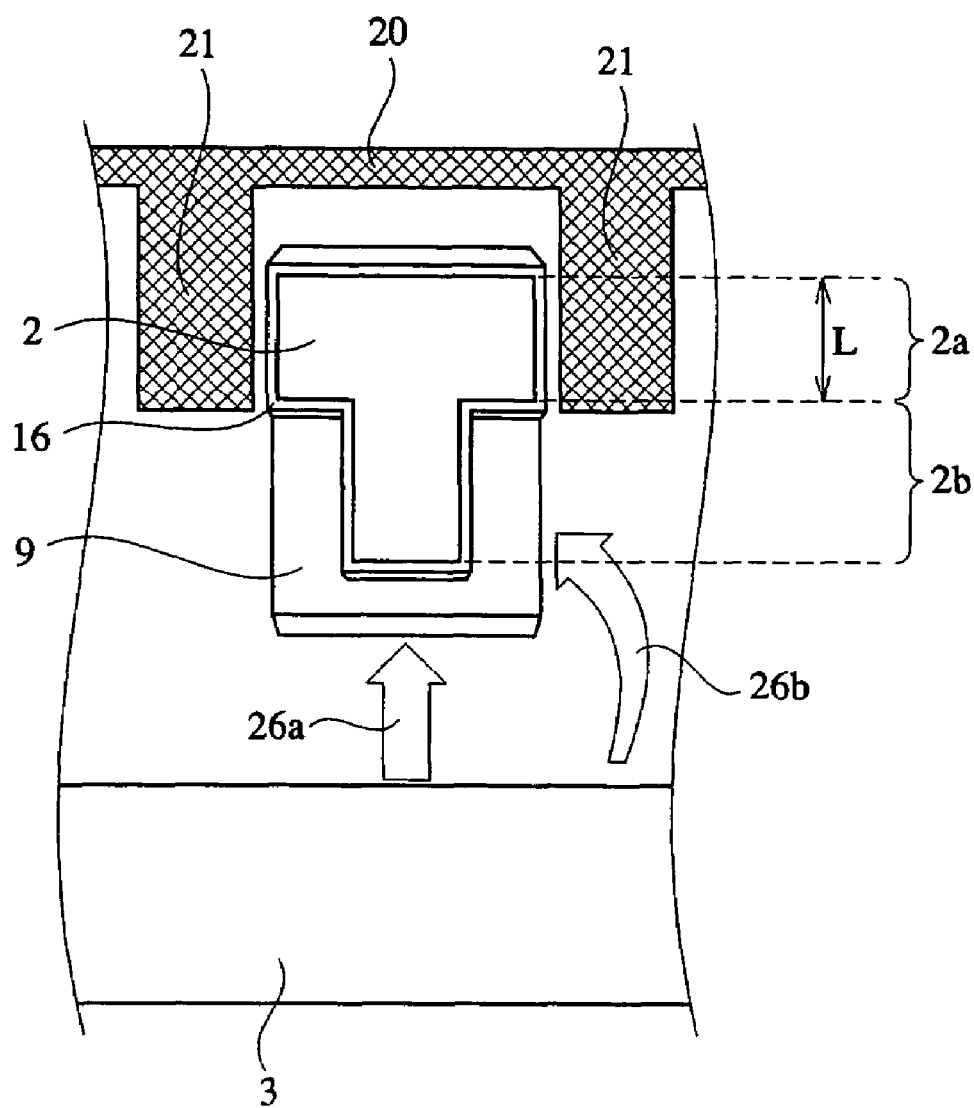
FIG. 4 is a partial, enlarged top view showing a light-emitting portion and its surroundings.

FIG. 4 is a top view showing a light-emitting portion 1 and its surrounding. Each wiring is omitted for the simplification of explanation. The light-emitting portion 1 has a light-extracting portion 9 in an upper surface not covered by the cathode 2. The second grooves 21 suppress those having no contribution to light emission among sneak current, so that those having contribution to light emission (sneak current 26b) can flow immediately below the light-extracting portion 9 at a high efficiency. This increases the light output, enabling low-voltage driving.

To divide or partition four light-emitting portions 1 to a block, the first rectangular groove 20 is formed in the conductive layer 11. Further, the second grooves 21 are formed between the adjacent light-emitting portions 1, such that they extend from a side portion of the first groove 20 on the farthest side from the anode 3. The second grooves 21 preferably extend substantially to a tip end (the farthest side from the anode 3) of the light-extracting portion 9. The second grooves 21 can block sneak current having no contribution to light emission, thereby increasing the intensity of light emitted and lowering a driving voltage.

The structure of each part of the light-emitting diode array of the present invention other than the first and second grooves 20, 21 will be explain below in detail.

(1) Substrate and Conductive Layer

The substrate 10 may be a conductive or semiconductive substrate that can be used for light-emitting diodes. Either of an n-type substrate and a p-type substrate, for instance, an n-type GaAs substrate, etc. may be used. The substrate 10 may be insulated from the conductive layer 11 with a high-resistivity layer such as an undoped GaAs layer formed therebetween, or with a semiconductor layer opposite in polarity to the conductive layer 11 formed therebetween. In the case of the n-type GaAs substrate 10, the conductive layer 11 is preferably a p-type GaAs.

(2) Light-Emitting Portion

The type and thickness of a compound semiconductor crystal layer laminated on the conductive layer 11 may be properly determined depending on the desired light emission wavelength and light-emitting power. Usable as the compound semiconductors are, for instance, AlGaAs, AlGaInP, etc. The light-emitting portion 1 preferably has a double hetero structure comprising a clad layer of a first conductor type, an active layer and a clad layer of a second conductor type. Each light-emitting portion 1 may be formed by separating an epitaxial layer formed on the conductive layer 11 by a mesa-etched groove 19.

In the embodiment shown in FIG. 3, the light-emitting portion 1 in the light-emitting diode array comprises a p-type AlGaAs etching-stopper layer 12, a p-type AlGaAs clad layer 13, a p-type AlGaAs active layer 14, an n-type AlGaAs clad layer 15, and an n-type GaAs cap layer 16, which are successively formed on the p-type GaAs conductive layer 11 on the n-type GaAs substrate 10. The n-type GaAs cap layer 16 in the light-extracting portion 9 is removed by etching.

An area directly associated with light emission in the light-emitting portion 1 has a double-hetero structure in which the p-type AlGaAs active layer 14 having an energy band gap corresponding to the light-emitting wavelength is sandwiched by the p-type AlGaAs clad layer 13 (first-conductive-type clad layer), and the n-type AlGaAs clad layer 15 (second-conductive-type clad layer) both having larger energy band gaps than that of the layer 14.

(3) Mesa-Etched Groove

To form pluralities of separate light-emitting portions 1 and bonding portions 8, namely to separate the light-emitting portions 1 and the bonding portion 8 like islands, a mesa-etched groove 19 is formed to the conductive layer 11 or the etching-stopper layer 12. Because of the mesa-etched groove 19 between individual bonding portions 8, there is no short-circuiting between bonding pads. Because the mesa-etched groove 19 between the bonding portions 8 has a relatively small area, dividing the bonding portions 8 like islands does not cause decrease in an etching speed due to a loading effect.

(4) Insulating Film

As shown in FIG. 3, the light-emitting portions 1, the bonding portions 8 and the mesa-etched groove 19 are entirely covered with the first insulating layer 17 and the second insulating layer 18. As described below, a third insulating layer 24 and a fourth insulating layer 25 are formed on the electrodes and the wirings except for the bonding pads 6a, 6c. Each bonding pad 6c, 6a is provided with a bonding window 27c, 27a, and each bonding pad 6c, 6a is connected to an IC driver (not shown) by wire bonding via the window 27c, 27a.

(5) Electrode and Wiring

One of the first and second electrodes may be a cathode, and the other may be an anode. For example, the first electrodes may be a cathode or an anode. Since each electrode is required to have good bonding characteristics and ohmic connectivity to an underlying layer, it is preferably composed of pluralities of metal layers. For example, the anode may be a laminate electrode of AuZn/Ni/Au, Ti/Pt/Au, etc. and the cathode may be a laminate electrode of AuGe/Ni/Au, etc.

Since the common wirings 4 and the lead wirings 5 should have good bonding characteristics and adhesion to an upper layer and/or an under layer, they are preferably composed of pluralities of metal layers. The uppermost layer and/or the undermost layer preferably have layers of metals such as Ti, Mo, TiW, etc. having good bonding characteristics. They may have laminate structures such as Ti/Au/Ti, Mo/Au/Mo, TiW/Au/TiW, etc. When the anode 3 and the common wirings 4 are formed simultaneously to simplify the production process, they may be laminates of Ti/Pt/Au/Ti, etc.

In each electrode, the metal layers can be formed by a resistance-heating vapor deposition method, an electron beam-heating vapor deposition method, a sputtering method, etc., and the oxide layer can be formed by various known film-forming methods. A heat treatment (alloying) is preferably performed on the metal layers of cathode and anode, to make an ohmic electrode.

Part of the n-type GaAs cap layer 16 in each light-emitting portion 1 is removed by etching, such that an exposed upper surface of the n-type AlGaAs clad layer 15 constitutes an light-extracting portion 9, and that the remaining upper surface of the n-type GaAs cap layer 16 is covered with the cathode 2 having the same shape for ohmic contact.

The cathode 2 formed on the upper surface of the light-emitting portion 1 is in a T shape comprising a connection portion 2a extending from one end (the farther side from the anode 3) substantially in the width of the light-emitting portion 1, and an elongated portion 2b extending from the connection portion 2a on a center portion of the light-extracting portion 9. Accordingly, not only a straight current 26a flowing from the anode 3 immediately below the light-emitting portion 1 but also a sneak current 26b can be guided to a region immediately below the light-extracting portion 9.

Figure 5A:
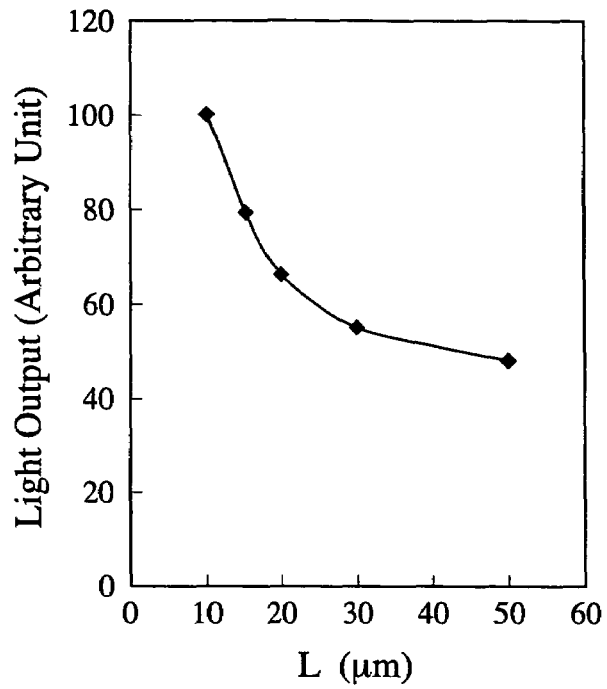
FIG. 5(a) is a graph showing the relation between a cathode structure (the length of a connecting portion) and a light output in the light-emitting diode array of the present invention.
Figure 5B:
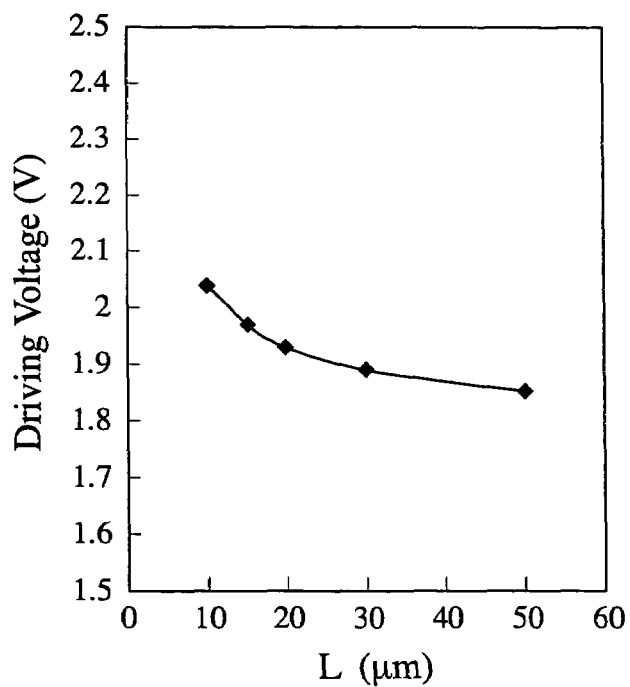
FIG. 5(b) is a graph showing the relation between a cathode structure (the length of a connecting portion) and a driving voltage in the light-emitting diode array of the present invention.

Light output can be improved by adjusting the width of the light-extracting portion 9 and the length of the cathode 2. FIGS. 5(a) and 5(b) show the relation between the length L of the connection portion 2a of the cathode 2, and light output and driving voltage, respectively, when the width of the light-extracting portion (longitudinal length) is 12.5 µm. As shown in FIGS. 5(a) and 5(b), by making the length L of the connection portion 2a 20 µm less, and thus by making the light-extracting portion 9 longer correspondingly, without changing the length of the entire light-emitting portion 1 in a chip width direction, the light output can be drastically improved while suppressing a driving voltage. The extension portion 2b of the cathode 2 may have a shape comprising pluralities of stripes, networks, etc., as long as fine working is possible.

The cathode 2 on each light-emitting portion 1 is connected to each common wiring 4 via a lead wire 5c, and each common wiring 4 is connected to each bonding pad 6c on each bonding portion 8c via a lead wire 5k. Each anode 3 is connected to each bonding pad 6a on each bonding portion 8a via a lead wire 5a.

The lead wires 5a, 5c are respectively connected to the anodes 3 and the cathodes 2 via contact holes 7a, 7c formed by etching the first insulating layer 17 and the second insulating layer 18. The lead wires 5k are connected to the common wirings 4 formed between the first insulating layer 17 and the second insulating layer 18 via contact holes 7k formed by etching the second insulating layer 18.

[2] Production Method of Light-Emitting Diode Array

The preferred method for producing the light-emitting diode array of the present invention will be explained referring to FIGS. 1 to 3. The p-type GaAs conductive layer 11 (carrier concentration=$4 \times 10^{19}$ cm$^{-3}$, thickness=1 µm), the p-type AlGaAs etching stopper layer 12 (carrier concentration=$3 \times 10^{19}$ cm$^{-3}$, thickness=0.1 µm), the p-type AlGaAs clad layer 13 (carrier concentration=$1 \times 10^{18}$ cm$^{-3}$, thickness=1 µm), the p-type AlGaAs active layer 14 (carrier concentration=$1 \times 10^{18}$ cm$^{-3}$, thickness=1 µm), the n-type AlGaAs clad layer 15 (carrier concentration=$2 \times 10^{18}$ cm$^{-3}$, thickness=3 µm), and the n-type GaAs cap layer 16 (carrier concentration=$1 \times 10^{18}$ cm$^{-3}$, thickness=0.5 µm) are first successively grown on the n-type GaAs substrate 10 by a metal organic vapor phase growth (MOVPE) method.

The resultant crystal layers are subjected to selective wet etching. The n-type GaAs cap layer 16 is first removed from the light-emitting portions 1 except for those in contact with the cathodes 2 and the bonding portions 8. At this stage, the light-extracting portions 9 are formed in the light-emitting portions 1. The first mesa-etched groove 19 is then formed to such depth that the etching stopper layer 12 is exposed, to provide the separate light-emitting portions 1 and the separate bonding portions 8 both constituted by the epitaxial layers on the etching-stopper layer 12.

Further formed on the p-type GaAs conductive layer 11 are the first groove 20 for separating the light-emitting portions 1 to blocks and the second grooves 21 extending from one side of the first groove 20 in a comb shape between the light-emitting portions 1. In this case, the first and second mesa-etched grooves 20, 21 preferably have such depth that the n-type GaAs substrate 10 is slightly etched, so that no conductive layer 11 remains in areas corresponding to the grooves 20, 21 even though there are etching errors.

The cathodes 2 of AuGe/Ni/Au and the anodes 3 of AuZn/Ni/Au are formed by a vapor deposition method and a lift-off method. Next, the first insulating layer 17 is grown on the entire upper surface of the light-emitting diode array by a chemical vapor deposition (CVD) method. The common wirings 4 of Ti/Au/Ti is formed on the first insulating layer 17 by a vapor deposition method and a lift-off method.

After the second insulating layer 18 is grown on the entire upper surface of the light-emitting diode array by the CVD method, the contact holes 7c, 7a, 7k are formed on the cathodes 2, the anodes 3 and the common electrodes 4. Ti/Au/Ti is sputtered and ion-milled between each contact hole 7c and each contact hole 7k, between each contact hole 7a and each bonding portion 8a, between each contact hole 7k and each bonding portion 8c, and on each bonding portion 8c, 8a, to form the lead wires 5c, 5a, 5k and the bonding pads 6c, 6a both constituted by Ti/Au/Ti.

The first insulating layer 17 and the second insulating layer 18 on the light-extracting portions 9 and the scribe areas 23 are removed by dry etching using a known mixed gas such as CHF$_3$/O$_2$, etc. To prevent moisture, etc. from entering, the third insulating layer 24 and the fourth insulating layer 25 are vapor-deposited to cover the entire upper surface of the light-emitting diode array. Because the fourth insulating layer 25 is final passivation, it is preferably a dense film such as a nitride film, etc. When the third insulating layer 24 and the fourth insulating layer 25 have different refraction indexes, it is necessary to determine their thickness so that they do not act as reflection films at the wavelength of light emitted. Specifically, the total thickness of the third insulating layer 24 and the fourth insulating layer 25 is preferably less than 1 µm as described in JP 2003-031840 A.

Finally, the third insulating layer 24 and the fourth insulating layer 25 on the bonding pads 6 are etched to open bonding windows 27.

Figure 6:
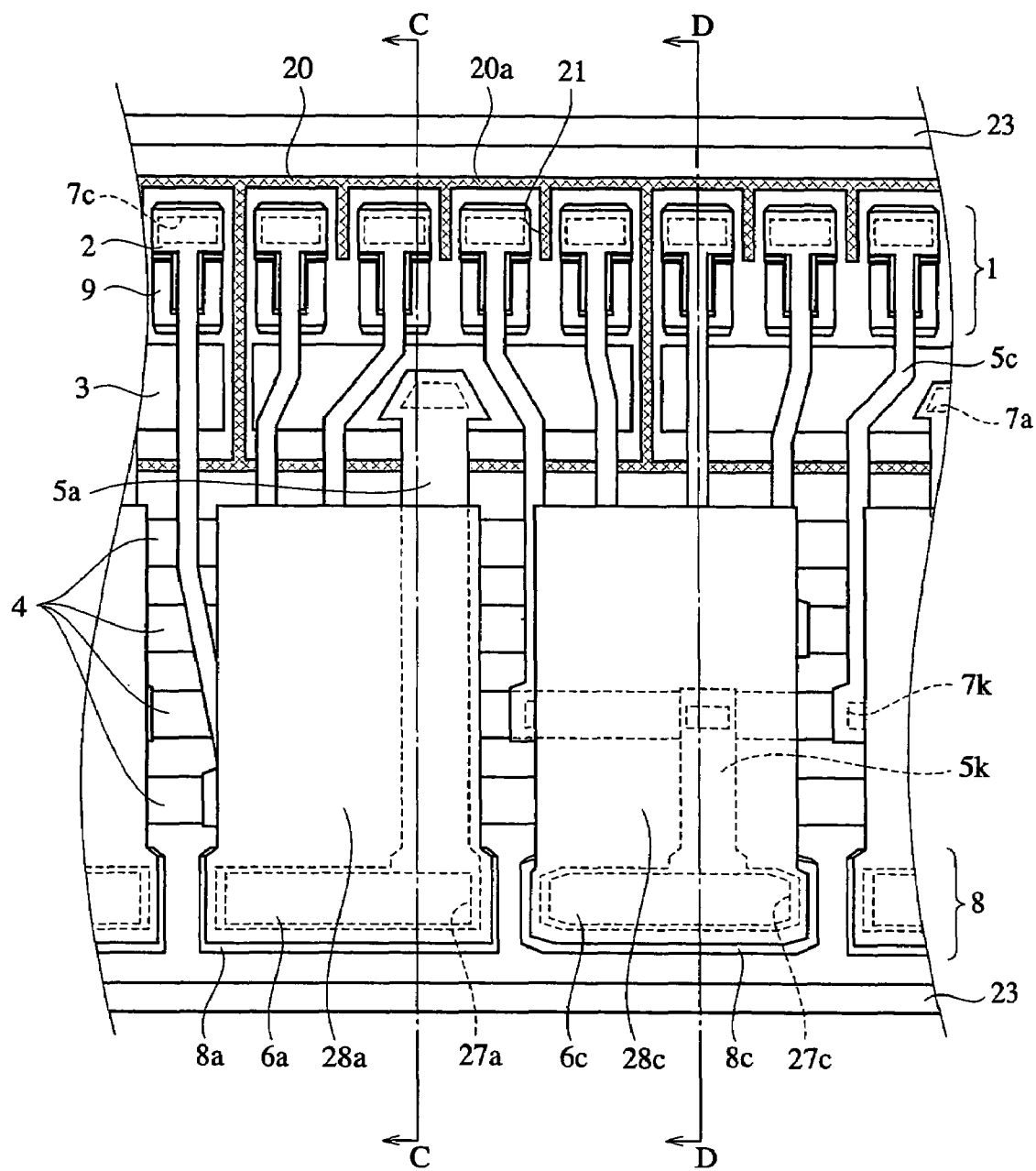
FIG. 6 is a top view showing the light-emitting diode array according to another embodiment of the present invention.

A light-emitting diode array according to another embodiment of the present invention is shown in FIGS. 6 and 7. The light-emitting diode array in this embodiment is the same as that shown in FIGS. 1 to 4, except that bonding pads 6c, 6a are provided with bonding windows 27c, 27a, and that third and fourth bonding pads 28c, 28a connected to the bonding windows 27c, 27a extend on the fourth insulating layer 25 covering common wirings 4. The third and fourth bonding pads 28c, 28a may be called "folded bonding pads," because they are folded from the bonding windows 27c, 27a onto the fourth insulating layer 25.

The third and fourth bonding pads 28c, 28a function as connection portions to IC drivers in place of the bonding pads 6c, 6a. This structure can reduce the length of the bonding portions 8c, 8a in the chip width direction of the LED chip (light-emitting diode array) As a result, the LED chip width of the light-emitting diode array can be reduced, enabling the production of LED chips as many as about 1:5 times the conventional ones per a wafer. Materials for the bonding pads 28c, 28a may be Ti/Au/Ti like the bonding pads 6c, 6a.

Though any of the above embodiments has a 4×4 structure with four light-emitting portions in one block and four common electrodes, the light-emitting diode array of the present invention is not restricted to this structure, it may have a 2×2 structure with two light-emitting portions in one block and two common electrodes, or a 3×3 structure, generally an n×n structure, wherein n is a natural number. Though the light-emitting diode array in this embodiment has a resolution of 1200 dpi, for instance, it is of course not restrictive.

Though the common wirings 4 have such length that they are included in one cell in the above embodiments, they may be long enough to extend over pluralities of cells in the LED chip. For instance, because the LED chip having a resolution of 1200 dpi usually has 256 or 384 dots per one chip, the number of cells in the LED chip is 4 to 6. However, the common wirings 4 may be designed long enough to connect pluralities of cells.

The light-emitting diode array of the present invention having the above structure can provide a high light output at a low driving voltage. In addition, because of the reduced LED chip width due to decrease in the number of bonding pads and common wirings, it can be obtained from one wafer in larger numbers as LED chips.

With the third and fourth bonding pads respectively connected to the first and second bonding pads extending on the common wirings covering the insulating layer, the width of the bonding portions in a chip width direction can be reduced, resulting In further increase in the number of LED chips per a wafer.

By forming the separate light-emitting portions by a mesa-etched groove, their size can be easily controlled. Also, by forming the separate bonding portions by a mesa-etched groove, insulation is secured between Au wiring layers formed on the bonding portions. The light-emitting diode array having this structure has such excellent mass productivity that it can be produced at low cost and high yield.

Further, high light output, low driving voltage, low cost and high yield can be achieved by any of the following: (1) each first electrode is in a T shape comprising a connection portion extending from one end (the farther side from the second electrode) of the light-emitting portion substantially in its width, and elongated portions extending from the connection portion on a center portion of the light-emitting portion (namely, the length the ad of the GaAs cap layer in ohmic contact with the first electrode is set); (2) the second grooves are formed in the conductive layer between the adjacent light-emitting portions to suppress sneak current having no contribution to light emission; (3) the first groove surrounding each block is in a rectangular shape comprising a groove on the side of the first electrodes, a groove on the side of the second electrode, and a pair of grooves separating the adjacent blocks, the second grooves being in a comb shape connected to the groove on the side of the first electrodes; and (4) each second groove is formed substantially to a tip end of the connection portion of the first electrode (on the side of the second electrode).

When the length of the connection portion of the first electrode in the transverse direction of the array is made as short as 20 µm or less in the light-emitting portion with a predetermined width, namely when the light-extracting portion is elongated in a chip width direction correspondingly, the light output of the light-emitting diode array tends to increase.

What is claimed is:

1. A light-emitting diode array comprising a conductive layer formed on a substrate, pluralities of separate light-emitting portions formed on said conductive layer, a first groove formed in said conductive layer to divide said light-emitting portions to blocks, first electrodes formed on at least part of an upper surface of each light-emitting portion, a second electrode formed directly on said conductive layer in each block, switching common wirings separately connecting said first electrodes and first bonding pads each connected to each common wiring, and second bonding pads each connected to each second electrode, said first bonding pads and said second bonding pads being arranged longitudinally in a row, and a ratio of the number of said first bonding pads to the number of said second bonding pads being 1:n(n≧3).

2. The light-emitting diode array according to claim 1, wherein third and fourth bonding pads are each connected to each of said first and second bonding pads and extend on an insulating layer covering said common wirings.

3. The light-emitting diode array according to claim 1, wherein said first and second bonding pads are formed on separate bonding portions formed longitudinally in a row like islands on said conductive layer.

4. The light-emitting diode array according to claim 3, wherein said light-emitting portions and said bonding portions are separately formed by mesa-etched grooves.

5. The light-emitting diode array according to claim 1, wherein said first electrodes are in a T shape comprising a connection portion extending from an end side (the farther side from said second electrode) of said light-emitting portion substantially in the width thereof, and an elongated portion extending from the connecting portion in a center portion of said light-emitting portion.

6. The light-emitting diode array according to claim 1, wherein the connection portion of said first electrode is as long as 20 µm or less in a chip width direction of the array.

7. The light-emitting diode array according to claim 1, wherein said conductive layer is provided with second grooves between the adjacent light-emitting portions.

8. The light-emitting diode array according to claim 7, wherein said first groove surrounding each block is in a rectangular shape comprising a groove on the side of said first electrodes, a groove on the side of said second electrode, and a pair of grooves separating adjacent blocks; and wherein said second grooves are connected to the groove on the side of said first electrodes in a comb shape.

9. The light-emitting diode array according to claim 7, wherein said second grooves extend substantially to a tip end of the connection portion of said first electrodes on the side of said second electrode.

* * * * *